(12) United States Patent
Nishida

(10) Patent No.: US 8,638,177 B2
(45) Date of Patent: Jan. 28, 2014

(54) OPTICAL MODULE FOR ATOMIC OSCILLATOR AND ATOMIC OSCILLATOR

(75) Inventor: Tetsuo Nishida, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/418,688

(22) Filed: Mar. 13, 2012

(65) Prior Publication Data

US 2012/0235756 A1 Sep. 20, 2012

(30) Foreign Application Priority Data

Mar. 14, 2011 (JP) ................. 2011-055432

(51) Int. Cl.
*H01S 1/06* (2006.01)
*H03L 7/26* (2006.01)
*H03B 17/00* (2006.01)

(52) U.S. Cl.
USPC ............................. 331/94.1; 321/3

(58) Field of Classification Search
USPC ...................... 331/94.1, 3; 359/239
See application file for complete search history.

(56) References Cited

U.S. PATENT DOCUMENTS

| | | | |
|---|---|---|---|
| 6,201,821 B1 | 3/2001 | Zhu et al. | |
| 6,570,459 B1 | 5/2003 | Nathanson et al. | |
| 6,762,869 B2 * | 7/2004 | Maleki et al. | 359/239 |
| 6,806,784 B2 | 10/2004 | Hollberg et al. | |
| 6,900,702 B2 | 5/2005 | Youngner et al. | |
| 7,999,626 B2 * | 8/2011 | Chindo et al. | 331/94.1 |
| 8,279,016 B2 * | 10/2012 | Aoyama et al. | 331/94.1 |
| 2002/0163394 A1 | 11/2002 | Hollberg et al. | |
| 2010/0033256 A1 * | 2/2010 | Strabley et al. | 331/94.1 |

FOREIGN PATENT DOCUMENTS

| | | |
|---|---|---|
| EP | 1 473 605 | 11/2004 |
| JP | 2007-336136 | 12/2007 |
| JP | 2009-089116 | 4/2009 |
| JP | 2009-164334 | 7/2009 |
| JP | 2009-188598 | 8/2009 |

OTHER PUBLICATIONS

Extended European Search Report for Application No. 12 15 9014 mailed Aug. 1, 2012 (6 pages).

* cited by examiner

*Primary Examiner* — Joseph Chang
(74) *Attorney, Agent, or Firm* — Harness, Dickey & Pierce, P.L.C.

(57) ABSTRACT

An optical module for an atomic oscillator using a quantum interference effect includes a light source adapted to emit light including a fundamental wave having a predetermined wavelength, and sideband waves of the fundamental wave, a wavelength selection section receiving the light from the light source, and adapted to transmit the sideband waves, a gas cell encapsulating an alkali metal gas and irradiated with light transmitted through the wavelength selection section, and a light detection section adapted to detect an intensity of light transmitted through the gas cell, and the wavelength selection section including an optical filter section adapted to transmit light having a wavelength within a predetermined wavelength range, and an optical filter characteristic control section adapted to vary the wavelength range of light to be transmitted by the optical filter section.

17 Claims, 5 Drawing Sheets

OPTICAL MODULE FOR ATOMIC OSCILLATOR AND ATOMIC OSCILLATOR

This application claims priority to Japanese Patent Application No. 2011-055432 filed Mar. 14, 2011 which is hereby expressly incorporated by reference herein in its entirety.

BACKGROUND

1. Technical Field

The present invention relates to an optical module for an atomic oscillator and an atomic oscillator.

2. Related Art

In recent years, an atomic oscillator using coherent population trapping (CPT) as a quantum interference effect has been proposed, and downsizing of the device and reduction in power consumption have been expected. An atomic oscillator using CPT is an oscillator using a phenomenon (an electromagnetically induced transparency (EIT) phenomenon) that exists if an alkali metal atom is irradiated with two resonance lights with respective wavelengths (frequencies) that are different from each other simultaneously. As a result, absorption of the two resonance lights stops. For example, in JP-A-2009-89116, there is described an atomic oscillator as an atomic oscillator using CPT, which is configured to include an optical module having a light source for emitting coherent light, a gas cell for encapsulating alkali metal atoms, and a light receiving element for detecting the intensity of the light transmitted through the gas cell.

In the atomic oscillator using CPT, a semiconductor laser is used, for example, as the light source. In the atomic oscillator using the semiconductor laser as the light source, the drive current of the semiconductor laser is modulated to thereby cause a sideband wave in the light emitted from the semiconductor laser, and thus the EIT phenomenon is developed.

However, the light emitted from the semiconductor laser (the drive current of which is modulated) includes not only the sideband wave but also a fundamental wave (a carrier wave) having a center wavelength making no contribution to the EIT phenomenon. If the alkali metal atoms are irradiated with the fundamental wave, there is a case in which the wavelength (the frequency) of the light absorbed by the alkali metal atoms varies (the AC Stark effect) to thereby degrade the stability of the frequency of the atomic oscillator.

SUMMARY

An advantage realized by some aspects of the invention is to provide an optical module for an atomic oscillator, which is capable of providing an atomic oscillator with high frequency stability. Another advantage realized by some aspects of the invention is to provide an atomic oscillator having the optical module for an atomic oscillator, described above.

An aspect of the invention is directed to an optical module for an atomic oscillator using a quantum interference effect including a light source adapted to emit light including a fundamental wave having a predetermined wavelength, and sideband waves of the fundamental wave, a wavelength selection section receiving the light from the light source, and adapted to transmit the sideband waves, a gas cell encapsulating an alkali metal gas, and irradiated with light transmitted through the wavelength selection section, and a light detection section adapted to detect an intensity of light transmitted through the gas cell out of the light with which the gas cell is irradiated, wherein the wavelength selection section includes an optical filter section adapted to transmit light having a wavelength within a predetermined wavelength range, and an optical filter characteristic control section adapted to vary the wavelength range of light to be transmitted by the optical filter section.

According to such an optical module for an atomic oscillator, the wavelength selection section can decrease the intensity of the fundamental wave included in the light from the light source or eliminate the fundamental wave. Thus, it is possible to control or prevent the alkali metal atom from being irradiated with the fundamental wave making no contribution to the EIT phenomenon. Therefore, it is possible to reduce frequency variation due to the AC Stark effect to thereby provide an oscillator with high frequency stability. Further, since the wavelength selection section has the optical filter characteristic control section for varying the wavelength range of the light to be transmitted by the optical filter section, it is possible to correct the shift of the wavelength selection characteristics (the wavelength range of the light to be transmitted by the optical filter section) of the optical filter section due to manufacturing error, environmental variations, and so on.

The optical module for an atomic oscillator of the above aspect of the invention may be configured such that the optical filter section is an etalon, and the optical filter characteristic control section varies the wavelength range of the light to be transmitted by the optical filter section using an electro-optic effect.

According to such an optical module for an atomic oscillator, the optical filter section can have a simple configuration. Further, the wavelength selection characteristics of the optical filter section can be easily controlled with accuracy.

The optical module for an atomic oscillator of the above aspect of the invention may be configured such that the optical filter section includes a first mirror and a second mirror opposed to each other and adapted to reflect the light input to the wavelength selection section, and a substrate disposed between the first mirror and the second mirror, and the substrate is made of a compound semiconductor.

According to such an optical module for an atomic oscillator, the distance between the first and second mirrors can be shortened to thereby downsize the device.

The optical module for an atomic oscillator of the above aspect of the invention may be configured such that the optical filter characteristic control section includes a first electrode and a second electrode adapted to apply a voltage to the substrate.

According to such an optical module for an atomic oscillator, the optical filter characteristic control section can have a simple configuration.

The optical module for an atomic oscillator of the above aspect of the invention may be configured such that a base body made of a compound semiconductor is further provided, the light source is a semiconductor laser, the optical filter section and the light source are located above the base body, the first electrode is located on an opposite side of the base body relative to a side on which the optical filter section is located, and the second electrode is located on an opposite side of the optical filter section relative to a side on which the base body is located.

According to such an optical module for an atomic oscillator, since the wavelength selection section and the light source are provided to the same base body, downsizing of the device can be achieved.

It should be noted that in the descriptions related to the invention, in the case of using the term "above" in a phrase such as "a specific object (hereinafter referred to as "B") is formed "above" another specific object (hereinafter referred to as "A")," the term "above" includes both the case of forming B directly on A and the case of forming B indirectly on A via another object. Similarly, it is assumed that the term "below" includes both the case of forming B directly on the lower surface of A and the case of forming B indirectly below A via another object.

The optical module for an atomic oscillator of the above aspect of the invention may be configured such that the substrate of the optical filter section includes a first layer, a second layer, and a third layer stacked from the base body side in this order, a refractive index of the first layer and a refractive index of the third layer are smaller than a refractive index of the second layer, and the light emitted from the light source propagates through the second layer.

According to such an optical module for an atomic oscillator, the substrate can be used as an optical waveguide. Therefore, the beam diameter of the light emitted from the wavelength selection section can be controlled, and thus the gas cell can efficiently be irradiated with the light transmitted through the wavelength selection section.

The optical module for an atomic oscillator of the above aspect of the invention may be configured such that the light source is an edge emitting laser.

According to such an optical module for an atomic oscillator, the alignment between the light source (the edge emitting laser) and the wavelength selection section can be achieved by controlling the film thickness of the layers constituting the edge emitting laser. Therefore, the alignment accuracy between the light source and the wavelength selection section can be enhanced. Further, the optical element for making the laser beam from the light source enter the wavelength selection section becomes unnecessary.

The optical module for an atomic oscillator of the above aspect of the invention may be configured such that the light source is a surface emitting laser.

According to such an optical module for an atomic oscillator, since the surface emitting laser requires a small current for generating the gain compared to the edge emitting laser, a reduction in power consumption can be achieved.

Another aspect of the invention is directed to an atomic oscillator including the optical module for an atomic oscillator of one or more of the above aspects of the invention.

Since such an atomic oscillator includes the optical module for an atomic oscillator according to one or more of the aspects of the invention described above, it is possible to reduce the frequency variation due to the AC Stark effect to thereby enhance the frequency stability.

Still another aspect of the invention is directed to an atomic oscillator using a quantum interference effect including a light source adapted to emit light including a fundamental wave having a predetermined wavelength, and sideband waves of the fundamental wave, a wavelength selection section receiving the light from the light source, and adapted to transmit the sideband, a gas cell encapsulating an alkali metal gas and irradiated with light transmitted through the wavelength selection section, and a light detection section adapted to detect an intensity of light transmitted through the gas cell, wherein the wavelength selection section includes an optical filter section adapted to selectively emit light having a wavelength within a predetermined wavelength range, and an optical filter characteristic control section adapted to vary the wavelength range of light to be selected by the optical filter section.

According to such an atomic oscillator, the wavelength selection section can decrease the intensity of the fundamental wave included in the light from the light source or eliminate the fundamental wave. Thus, it is possible to control or prevent the alkali metal atom from being irradiated with the fundamental wave making no contribution to the EIT phenomenon. Therefore, it is possible to reduce the frequency variation due to the AC Stark effect to thereby provide an oscillator with high frequency stability. Further, since the wavelength selection section has the optical filter characteristic control section for varying the wavelength range of the light to be transmitted by the optical filter section, it is possible to correct the shift of the wavelength selection characteristics (the wavelength range of the light to be transmitted by the optical filter section) of the optical filter section due to manufacturing error, environmental variations, and so on.

BRIEF DESCRIPTION OF THE DRAWINGS

The invention will be described with reference to the accompanying drawings, wherein like numbers reference like elements.

DESCRIPTION OF AN EXEMPLARY EMBODIMENT

An exemplary embodiment of the invention will hereinafter be described with reference to the accompanying drawings.

Figure 1:
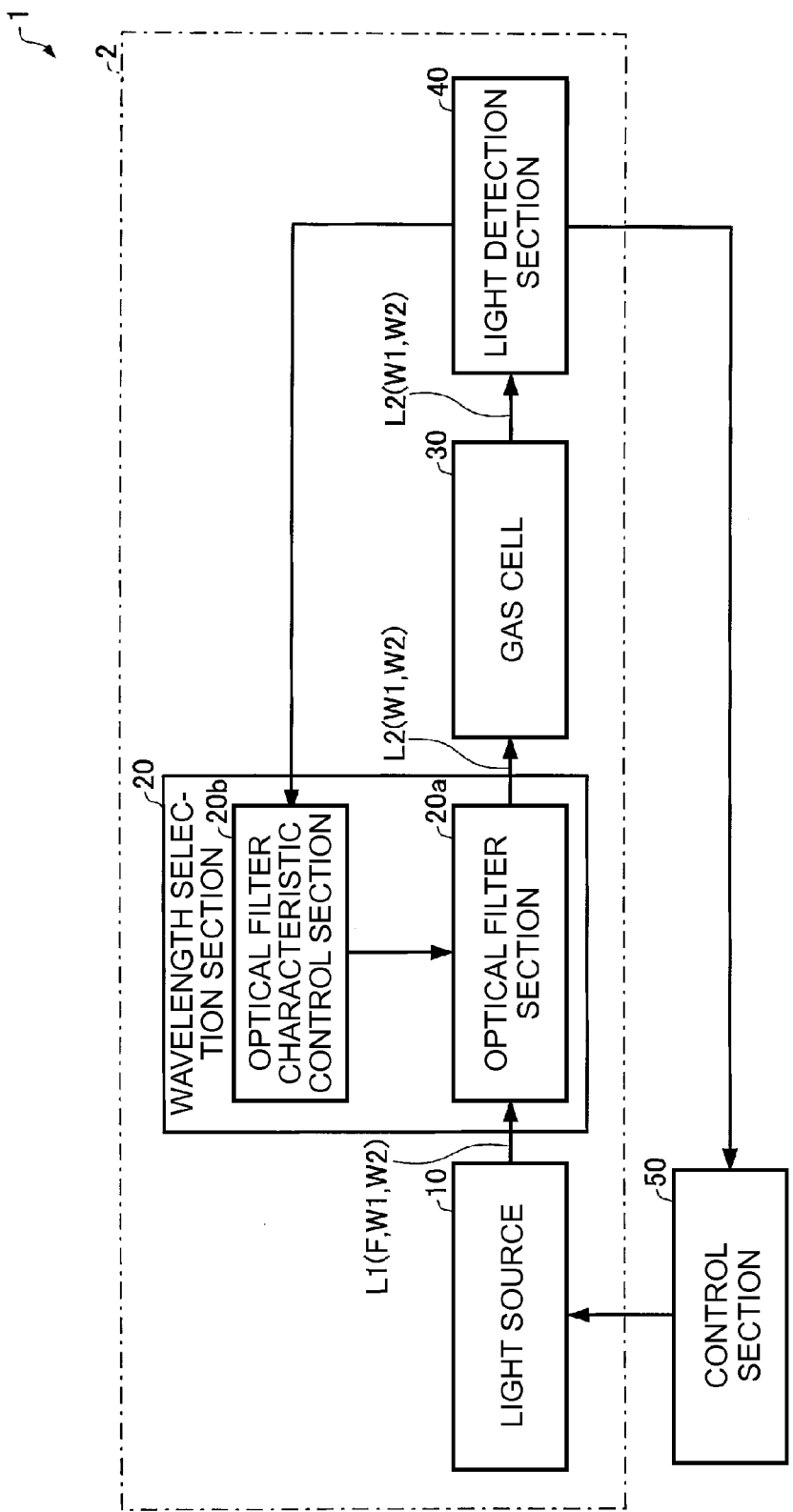
FIG. 1 is a functional block diagram of an atomic oscillator according to an embodiment of the invention.

Firstly, an optical module and an atomic oscillator according to the embodiment will be explained with reference to the accompanying drawings. The atomic oscillator according to the present embodiment includes an optical module according to the present embodiment. FIG. 1 is a functional block diagram of the atomic oscillator 1 according to the present embodiment. The atomic oscillator 1 is an oscillator using a quantum interference effect.

The atomic oscillator 1 includes an optical module 2 and a control section 50.

The optical module 2 includes a light source 10, a wavelength selection section 20, a gas cell 30, and a light detection section 40.

The light source 10 generates a first light L1 including a fundamental wave F having a predetermined center wavelength (center frequency), and first and second sideband waves W1, W2 having respective wavelengths different from each other.

The wavelength selection section 20 selects the first and second sideband waves W1, W2 from the first light L1, and then emits them as a second light L2. The wavelength selection device 20 has an optical filter section 20a for selectively emitting light in a predetermined wavelength range, and an optical filter characteristic control section 20b for varying the wavelength range of the light to be selected by the optical filter section 20a.

The gas cell 30 encapsulates an alkali metal gas, and is irradiated with the second light L2.

The light detection section 40 detects the intensity of the second light L2 transmitted through the gas cell 30.

The control section 50 performs control so that the difference in wavelength (frequency) between the first sideband wave W1 and the second sideband wave W2 becomes equal to the frequency corresponding to the difference in energy between the two ground levels of the alkali metal atoms encapsulated in the gas cell 30 based on the detection result of the light detection section 40. The control section 50 generates a detection signal having a modulation frequency $f_m$ based on the detection result of the light detection section 40. Then, the light source 10 modulates the fundamental wave F having a predetermined frequency $f_0$ based on the detection signal to thereby generate the first sideband wave W1 having a frequency $f_1 = f_0 + f_m$, and the second sideband wave W2 having a frequency $f_2 = f_0 - f_m$.

Figure 2A:
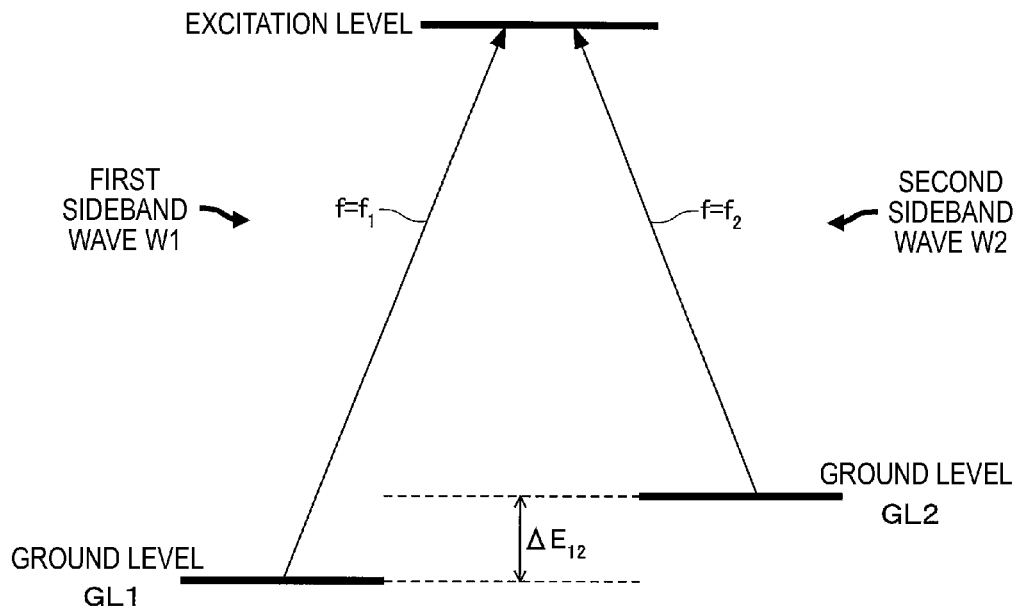
FIG. 2A is a diagram showing a relationship between a Λ-type three-level model of an alkali metal atom, and a first sideband wave and a second sideband wave.
Figure 2B:
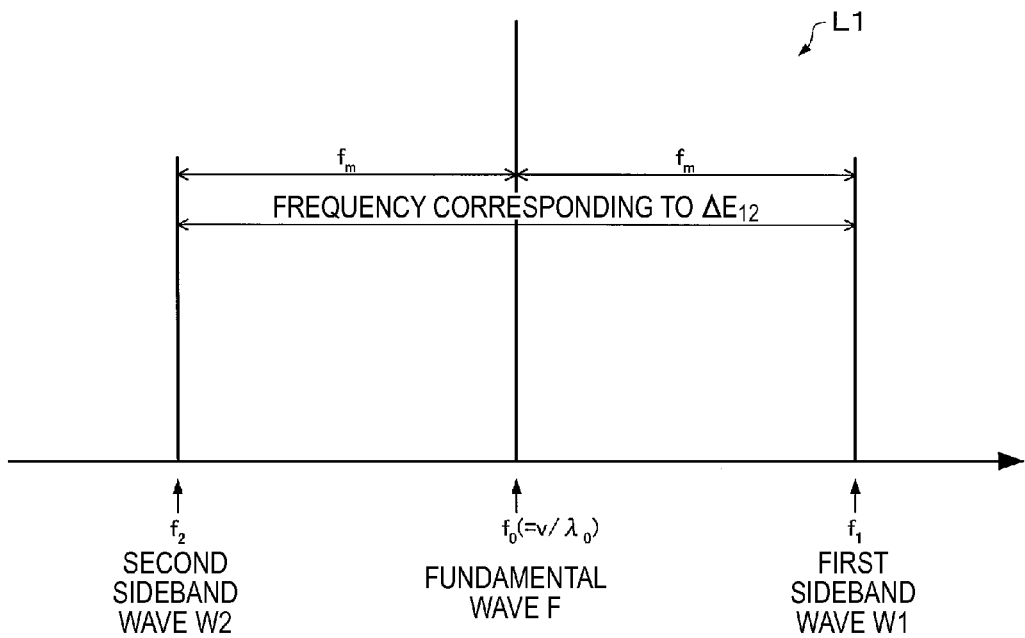
FIG. 2B is a diagram showing a frequency spectrum of a first light generated by the light source.

FIG. 2A is a diagram showing a relationship between a Λ-type three-level model of the alkali metal atoms, and the first sideband wave W1 and the second sideband wave W2. FIG. 2B is a diagram showing a frequency spectrum of the first light L1 generated by the light source 10.

As shown in FIG. 2B, the first light L1 generated in the light source 10 includes the fundamental wave F having the center frequency $f_0$ ($=v/\lambda_0$: $v$ denotes the speed of light; and $\lambda_0$ denotes the center wavelength of the laser beam), the first sideband wave W1 having the frequency $f_1$ in the upper sideband with respect to the center frequency $f_0$, and the second sideband wave W2 having the frequency $f_2$ in the lower sideband with respect to the center frequency $f_0$. The frequency $f_1$ of the first sideband wave W1 is obtained as $f_1 = f_0 + f_m$, and the frequency $f_2$ of the second sideband wave W2 is obtained as $f_2 = f_0 - f_m$.

As shown in FIGS. 2A and 2B, the frequency difference between the frequency $f_1$ of the first sideband wave W1 and the frequency $f_2$ of the second sideband wave W2 coincides with the frequency corresponding to the energy difference $\Delta E_{12}$ between the ground level GL1 and the ground level GL2 of the alkali metal atom. Therefore, the alkali metal atoms cause the EIT phenomenon with the first sideband wave W1 having the frequency $f_1$ and the second sideband wave W2 having the frequency $f_2$.

Here, the EIT phenomenon will be explained. There is known that the interaction between an alkali metal atom and the light can be explained with the Λ-type three-level model. As shown in FIG. 2A, an alkali metal atom has two ground levels, and if the alkali metal atom is irradiated with either one of the first sideband wave W1 having the wavelength (frequency $f_1$) corresponding to the energy difference between the ground level GL1 and the excitation level and the second sideband wave W2 having the wavelength (frequency $f_2$) corresponding to the energy difference between the ground level GL2 and the excitation level alone, light absorption occurs. However, as shown in FIG. 2B, if an alkali metal atom is irradiated with the first sideband wave W1 and the second sideband wave W2 having the respective frequencies $f_1$, $f_2$ the difference of which ($f_1 - f_2$) accurately coincides with the frequency corresponding to the energy difference $\Delta E_{12}$ between the ground level GL1 and the ground level GL2 simultaneously, a superposition state of the two ground levels, namely the quantum interference state, occurs to thereby cause a transparency phenomenon (the EIT phenomenon) in which the excitation to the excitation level stops, and the first sideband wave W1 and the second sideband wave W2 are transmitted through the alkali metal atom. By detecting and then controlling the steep variation in the light absorption behavior occurring when the frequency difference $f_1 - f_2$ between the first sideband wave W1 and the second sideband wave W2 is shifted from the frequency corresponding to the energy difference $\Delta E_{12}$ between the ground level GL1 and the ground level GL2 using the EIT phenomenon, a highly accurate oscillator can be manufactured.

However, if the gas cell 30 is directly irradiated with the first light L1 shown in FIG. 2B, the gas cell 30, namely the alkali metal atoms, is irradiated with the fundamental wave F simultaneously with the first sideband wave W1 and the second sideband wave W2. If the alkali metal atoms are irradiated with the fundamental wave F making no contribution to the EIT phenomenon, the wavelength (frequency) of the light absorbed by each alkali metal atom varies due to the AC Stark effect. Thus, the amount of the first sideband wave W1 and the second sideband wave W2 transmitted through the alkali metal atoms varies. In the oscillator using the EIT phenomenon, the amount of the first sideband wave W1 and the second sideband wave W2 transmitted through the alkali metal atoms is detected to thereby stabilize the modulation frequency $f_m$, and the modulation frequency $f_m$ is used as the output of the oscillator to thereby enhance the frequency stability of the oscillator. Therefore, the AC Stark effect caused by the fundamental wave F degrades the detection accuracy of the first sideband wave W1 and the second sideband wave W2 to thereby degrade the stability of the modulation frequency $f_m$. Therefore, it degrades the frequency stability of the oscillator.

Figure 3:
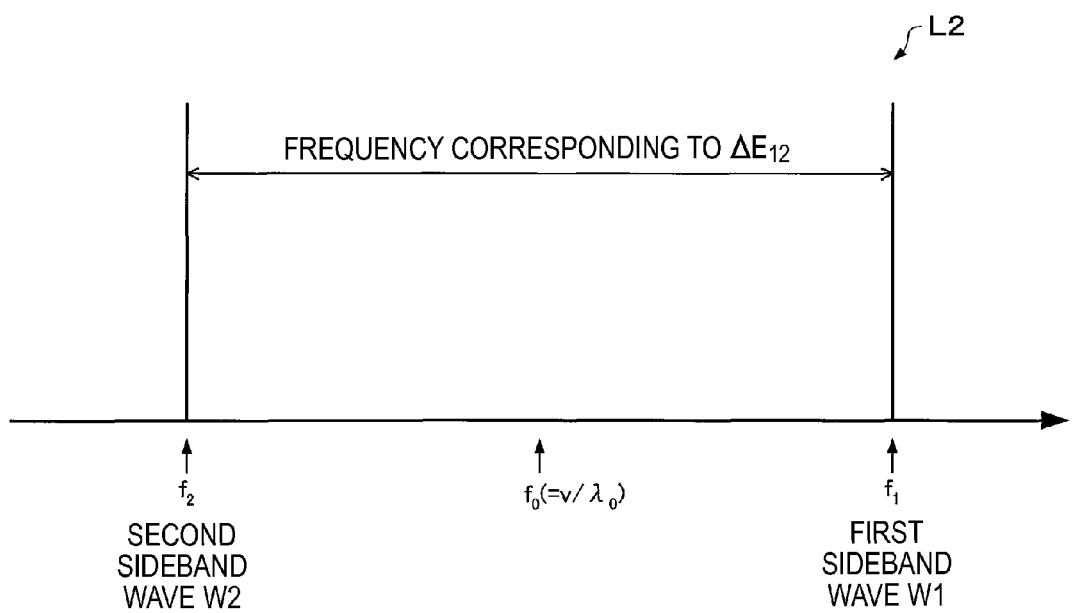
FIG. 3 is a diagram showing a frequency spectrum of a second light emitted from a wavelength selection section.

FIG. 3 is a diagram showing a frequency spectrum of the second light L2 emitted from the wavelength selection section 20.

The second light L2 is light with the fundamental wave F eliminated or decreased in intensity as compared to the first light L1. In the example shown in FIG. 3, the second light L2 only has the first sideband wave W1 having the frequency $f_1$ in the upper sideband with respect to the center frequency $f_0$, and the second sideband wave W2 having the frequency $f_2$ in the lower sideband with respect to the center frequency $f_0$. As described above, in the optical module 2, it is possible to decrease the intensity of the fundamental wave F or to eliminate the fundamental wave F using the wavelength selection section 20.

Hereinafter, a more specific configuration of the atomic oscillator according to the present embodiment will be explained.

Figure 4:
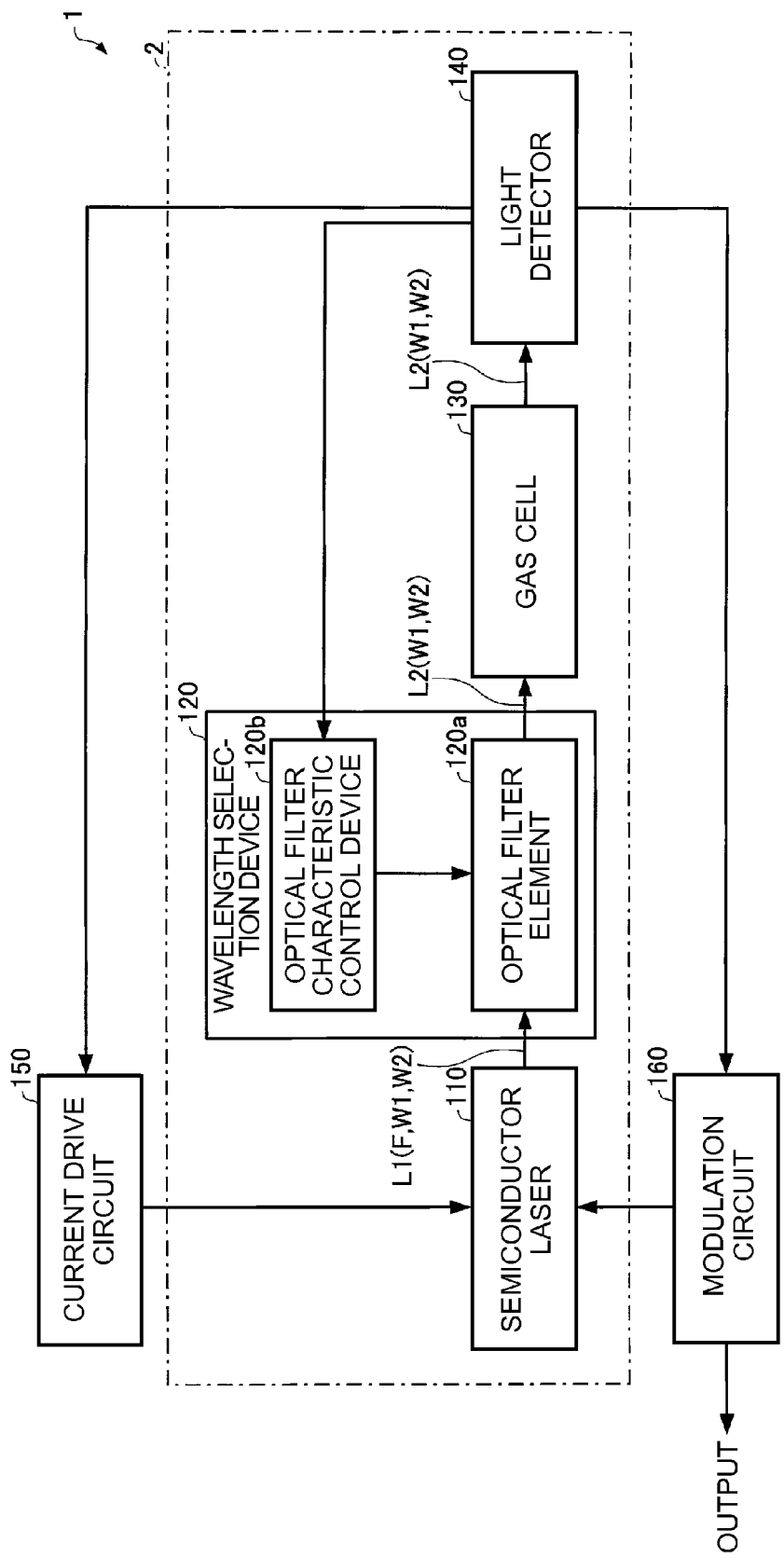
FIG. 4 is a block diagram showing a configuration of the atomic oscillator according to the present embodiment.

FIG. 4 is a block diagram showing a configuration of the atomic oscillator 1.

As shown in FIG. 4, the atomic oscillator 1 includes the optical module 2, a current drive circuit 150, and a modulation circuit 160.

The optical module 2 includes a semiconductor laser 110, a wavelength selection device 120, the gas cell 130, and a light detector 140.

The semiconductor laser 110 generates the first light L1 including the fundamental wave F having the predetermined center wavelength, and first and second sideband waves W1, W2 having respective wavelengths different from each other. The laser beam (the first light L1) emitted from the semiconductor laser 110 is controlled in the center frequency $f_0$ (the center wavelength $\lambda_0$) by the drive current output by the current drive circuit 150, and is then modulated by the output signal (the modulation signal) of the modulation circuit 160. In other words, by superimposing an alternating current having a frequency component of the modulation signal with the drive current derived from the current drive circuit 150, the first light L1 emitted by the semiconductor laser 110 can be modulated. Thus, the first sideband wave W1 and the second sideband wave W2 are generated in the first light L1. The light generated in the semiconductor laser 110 has a coherent property, and is therefore suitable for obtaining the quantum interference effect.

As shown in FIG. 2B, the first light L1 includes the fundamental wave F having the center frequency $f_0$ ($=v/\lambda_0$: $v$ denotes the speed of light; and $\lambda_0$ denotes the center wavelength of the first light L1), the first sideband wave W1 having the frequency $f_1$ in the upper sideband with respect to the center frequency $f_0$, and the second sideband wave W2 having the frequency $f_2$ in the lower sideband with respect to the center frequency $f_0$. The frequency $f_1$ of the first sideband wave W1 is obtained as $f_1=f_0+f_m$, and the frequency $f_2$ of the second sideband wave W2 is obtained as $f_2=f_0-f_m$.

The wavelength selection device 120 selects the first and second sideband waves W1, W2 from the first light L1, and then emits them as the second light L2. The wavelength selection device 120 has an optical filter element 120a for selectively emitting light in a predetermined wavelength range, and an optical filter characteristic control device 120b for varying the wavelength range of the light to be selected by the optical filter element 120a.

The optical filter element 120a is capable of selectively emitting the first sideband wave W1 and the second sideband wave W2 from the first light L1. Therefore, it is possible to decrease the intensity of the fundamental wave F of the first light L1 having entered the optical filter element 120a or to eliminate the fundamental wave F thereof, and then emit the result as the second light L2. In other words, in the second light L2, the intensity of the fundamental wave F is decreased or the fundamental wave F is eliminated as compared to the first light L1. In the example shown in FIG. 3, the second light L2 only has the first sideband wave W1 and the second sideband wave W2. The optical filter element 120a can be an etalon, or a fiber Bragg grating (FBG), as described below.

The optical filter characteristic control device 120b is capable of varying the wavelength range (the wavelength selection characteristics) of the light to be selected by the optical filter element 120a. The optical filter characteristic control device 120b is capable of varying the wavelength selection characteristics of the optical filter element 120a (e.g., an etalon) using an electro-optic effect. Here, the electro-optic effect denotes the phenomenon that the refractive index of a material with respect to the light is varied by externally applying a static electric field. The optical filter characteristic control device 120b applies an electric field to the optical filter element 120a, for example, to thereby vary the refractive index of the optical filter element 120a, and thus varies the wavelength selection characteristics of the optical filter element 120a. The wavelength selection device 120 is capable of correcting the shift of the wavelength selection characteristics of the optical filter element 120a due to manufacturing error, environmental variations (e.g., heat and light), and so on using the optical filter characteristic control device 120b, and is therefore capable of accurately selecting the first sideband wave W1 and the second sideband wave W2 from the first light L1.

It is also possible for the optical filter characteristic control device 120b to adjust the intensity of the electric field to be applied to the optical filter element 120a based on the output signal of the light detector 140 to thereby control the wavelength selection characteristics of the optical filter element 120a. In the optical module 2, the intensity of the electric field to be applied to the optical filter element 120a is adjusted by a feedback loop passing through, for example, the optical filter element 120a, the gas cell 130, the light detector 140, and the optical filter characteristic control device 120b, and thus the wavelength selection characteristics of the optical filter element 120a is controlled.

Further, it is also possible for the optical filter characteristic control device 120b to adjust the intensity of the electric field to be applied to the optical filter element 120a based on the data of the shift of the wavelength selection characteristics of the optical filter element 120a obtained in advance to thereby correct the shift of the wavelength selection characteristics of the optical filter element 120a.

The gas cell 130 includes gaseous alkali metal atoms (e.g., sodium (Na) atoms, rubidium (Rb) atoms, and cesium (Cs) atoms) encapsulated in a container. The gas cell 130 is irradiated with the second light L2 emitted from the wavelength selection device 120.

When the gas cell 130 is irradiated with the two light waves (the first sideband wave W1 and the second sideband wave W2) having different frequency (wavelength) corresponding to the energy difference between the two ground levels of the alkali metal atoms, the alkali metal atoms cause the EIT phenomenon. If, for example, the alkali metal atoms are cesium atoms, the frequency corresponding to the energy difference between the ground level GL1 at the DI line and the ground level GL2 is 9.19263 . . . GHz, and therefore, the EIT phenomenon occurs in response to the irradiation with the two light waves having the frequency difference of 9.19263 . . . GHz.

The light detector 140 detects the second light L2 having been transmitted through the gas cell 130, and then outputs a signal having a signal level corresponding to the amount of the light detected. The output signal of the light detector 140 is input to the current drive circuit 150 and the modulation circuit 160. Further, it is also possible for the output signal of the light detector 140 to be input to the optical filter characteristic control device 120b. The light detector 140 is, for example, a photo diode.

The current drive circuit 150 generates the drive current having a level corresponding to the output signal of the light detector 140, and then supplies the semiconductor laser 110 with the drive current to thereby control the center frequency $f_0$ (the center wavelength $\lambda_0$) of the first light L1. The center frequency $f_0$ (the center wavelength $\lambda_0$) of the first light L1 is finely adjusted and stabilized by the feedback loop passing through the semiconductor laser 110, the wavelength selection device 120, the gas cell 130, the light detector 140, and the current drive circuit 150.

The modulation circuit 160 generates a modulation signal having the modulation frequency $f_m$ corresponding to the output signal of the light detector 140. The modulation signal is supplied to the semiconductor laser 110 while the modulation frequency $f_m$ thereof is finely adjusted so that the output signal of the light detector 140 becomes enlarged. The laser beam emitted by the semiconductor laser 110 is modulated in accordance with the modulation signal to thereby generate the first sideband wave W1 and the second sideband wave W2.

It should be noted that the semiconductor laser 110, the wavelength selection device 120, the gas cell 130, and the light detector 140 correspond respectively to the light source 10, the wavelength selection section 20, the gas cell 30, and the light detection section 40 shown in FIG. 1. Further, the optical filter element 120a corresponds to the optical filter section 20a shown in FIG. 1, and the optical filter characteristic control device 120b corresponds to the optical filter characteristic control section 20b shown in FIG. 1. Still further, the current drive circuit 150 and the modulation circuit 160 correspond to the control section 50 shown in FIG. 1.

In the atomic oscillator 1 having such a configuration, since the alkali metal atoms fail to cause the EIT phenomenon unless the frequency difference between the first sideband wave W1 and the second sideband wave W2 of the first light L1 generated by the semiconductor laser 110 accurately coincides with the frequency corresponding to the energy difference between the two ground levels of the alkali metal atoms included in the gas cell 130, the detection amount of the light detector 140 varies (increases) in an extremely susceptible manner in accordance with the frequencies of the first sideband wave W1 and the second sideband wave W2. Therefore, feedback control is performed by the feedback loop passing through the semiconductor laser 110, the wavelength selection device 120, the gas cell 130, the light detector 140, and the modulation circuit 160 so that the frequency difference between the first sideband wave W1 and the second sideband wave W2 coincides with the frequency corresponding to the energy difference between the two ground levels of the alkali metal atoms with great accuracy. As a result, since the modulation frequency becomes an extremely stable frequency, the modulation signal can be used as the output signal (clock output) of the atomic oscillator 1.

Figure 5:
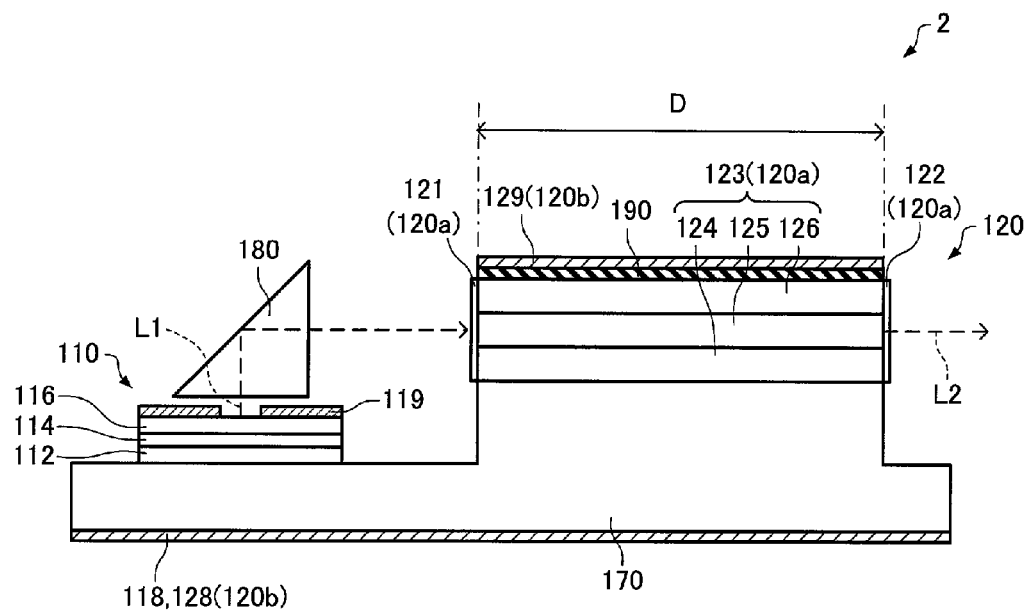
FIG. 5 is a cross-sectional view schematically showing a substantial part of an optical module according to the present embodiment.

FIG. 5 is a cross-sectional view schematically showing part (the semiconductor laser 110 and the wavelength selection device 120) of the optical module 2.

As shown in FIG. 5, the optical module 2 further includes a base body 170. The semiconductor laser 110 and the wavelength selection device 120 are provided to the base body 170. By forming the semiconductor laser 110 and the wavelength selection device 120 monolithically, downsizing of the device can be achieved.

The material of the base body 170 is preferably a compound semiconductor. Specifically, the material of the base body 170 is preferably a III-V semiconductor such as GaAs, InP, or GaN, or a II-VI semiconductor such as ZnO or ZnSe. Here, the case in which the material of the base body 170 is a first conductivity type (e.g., n-type) GaAs will be explained.

The semiconductor laser 110 is a surface emitting laser including a first semiconductor layer 112, an active layer 114, and a second semiconductor layer 116.

The first semiconductor layer 112 is formed on the base body 170. The first semiconductor layer 112 is, for example, a distributed Bragg reflector (DBR) semiconductor mirror having n-type (first conductivity type) $Al_{0.9}Ga_{0.1}As$ layers and n-type $Al_{0.15}Ga_{0.85}As$ layers stacked alternately.

The active layer 114 is formed on the first semiconductor layer 112. The active layer 114 has, for example, a multiple quantum well (MQW) structure having three quantum well structures stacked one another each composed of a GaAs well layer and an $Al_{0.3}Ga_{0.7}As$ barrier layer.

The second semiconductor layer 116 is, for example, a DBR semiconductor mirror having p-type (second conductivity type) $Al_{0.15}Ga_{0.85}As$ layers and p-type $Al_{0.9}Ga_{0.1}As$ layers stacked alternately.

The p-type second semiconductor layer 116, the active layer 114 with no impurity doped, and the n-type first semiconductor layer 112 constitute a pin diode.

An electrode 118 of the semiconductor laser 110 is formed on the lower surface of the base body 170. The electrode 118 is electrically connected to the first semiconductor layer 112 via the base body 170. The electrode 118 is one of the electrodes for driving the semiconductor laser 110. It should be noted that the electrode 118 is an electrode common to the electrode 118 and a first electrode 128 of the optical filter characteristic control device 120b described below.

An electrode 119 of the semiconductor laser 110 is formed on the upper surface of the second semiconductor layer 116. The electrode 119 is electrically connected to the second semiconductor layer 116. The electrode 119 is the other of the electrodes for driving the semiconductor laser 110.

When applying a forward voltage to the pin diode with the electrodes 118, 119, recombination of electrons and holes occurs in the active layer 114 to thereby generate emission of light due to the recombination. When the light generated there reciprocates between the second semiconductor layer 116 and the first semiconductor layer 112, stimulated emission occurs to thereby amplify the intensity of the light. When the light gain exceeds the light loss, laser oscillation occurs, and the laser beam (the first light L1) is emitted from the upper surface of the second semiconductor layer 116. The first light L1 emitted from the semiconductor laser 110 is reflected by a prism 180, and then enters the wavelength selection device 120 (the optical filter element 120a). The prism 180 is an optical element for changing the direction of the first light L1 to thereby make the first light L1 enter the wavelength selection device 120 (the optical filter element 120a). It should be noted that although in the present embodiment the prism 180 is used for changing the direction of the first light L1, any other optical elements capable of reflecting the first light L1 to thereby change the direction thereof can also be used. For example, a reflecting mirror or the like can be used.

In the optical module 2, the optical filter element 120a is an etalon. The optical filter element 120a includes a first mirror 121, a second mirror 122, and a substrate 123 disposed between the first mirror 121 and the second mirror 122. The mirrors 121, 122 are each a semi-transmissive mirror for transmitting part of the light while reflecting another part thereof.

The optical filter element 120a transmits light (the first sideband wave W1 and the second sideband wave W2) having wavelengths within a predetermined wavelength range out of the incident light L1 using the interferential action between the mirrors 121, 122. When the light enters the optical filter element 120a, light having a wavelength corresponding to the length (the distance between the first mirror 121 and the second mirror 122) D of the substrate 123 and the refractive index of the substrate 123 is selectively transmitted through the optical filter element 120a due to the interferential action between the mirrors 121, 122. In the optical filter element 120a, the transmittance with respect to the first sideband wave W1 and the second sideband wave W2 is high, and the transmittance with respect to the fundamental wave F is low. Thus, it is possible to decrease the intensity of the fundamental wave F of the first light L1 having entered the optical filter element 120a or to eliminate the fundamental wave F thereof, and then emit the result. Therefore, the optical filter element 120a can emit the second light L2 including only the first sideband wave W1 and the second sideband wave W2, for example.

The first mirror 121 and the second mirror 122 are opposed to each other via the substrate 123. The first mirror 121 and the second mirror 122 are each formed of, for example, a multilayer film having $Ta_2O_5$ films and $SiO_2$ films stacked alternately. The mirrors 121, 122 each have a layered structure formed by depositing, for example, three pairs of $Ta_2O_5$ film and $SiO_2$ film. The reflectance of the first mirror 121 and the second mirror 122 is, for example, 90%.

The substrate 123 is formed on the base body 170. The substrate 123 has a first layer 124, a second layer 125, and a third layer 126 formed in this order from the base body 170 side. The refractive index of the first layer 124 and the refractive index of the third layer 126 are lower than the refractive index of the second layer 125. Therefore, the first layer 124 and the third layer 126 each function as a cladding layer, and the second layer 125 functions as a core layer through which the first light L1 propagates. In other words, the substrate 123 is an optical waveguide through which the first light L1 propagates. In the optical module 2, since the substrate 123 is the optical waveguide, it is possible to control the beam diameter of the light L2 emitted from the optical filter element 120a to thereby efficiently irradiate the gas cell 130 with the light L2. The material of the first layer 124 and the third layer 126 is, for example, AlGaAs, and the material of the second layer 124 is, for example, GaAs.

It should be noted that the substrate 123 is not required to form an optical waveguide. The substrate 123 can be a single layer without including the plurality of layers 124, 125, and 126.

The material of the substrate 123 is not particularly limited, and can also be a III-V semiconductor such as GaAs, InP, or GaN, or a II-VI semiconductor such as ZnO or ZnSe. In the case of using, for example, GaAs as the material of the substrate 123, assuming that the free spectral range is 9.2 GHz, and the full width at half maximum is 0.3 GHz, the length D of the substrate 123 is about 28.46 mm. In the case of using $SiO_2$, which is also the material of the substrate of the etalon, the length of the substrate is about 70.66 mm. As described above, by using a compound semiconductor with a high refractive index as the material of the substrate 123, the length D of the substrate 123 can be shortened.

The optical filter characteristic control device 120b has the first electrode 128 and a second electrode 129 for applying an electric field to the optical filter element 120a. The optical filter characteristic control device 120b can supply the substrate 123 with the electric field by applying a voltage between the electrodes 128, 129. Thus, the electro-optic effect occurs to thereby vary the refractive index of the substrate 123, and thus, the wavelength selection characteristics of the optical filter element 120a can be varied. The first electrode 128 is located on the opposite side of the base body 170 to the side thereof on which the optical filter element 120a is located. The first electrode 128 is below the base body 170. The first electrode 128 is an electrode common to the first electrode 128 and the one electrode 118 of the semiconductor laser 110 described above. The second electrode 129 is located on the opposite side of the optical filter element 120a to the side thereof on which the base body 170 is located. The second electrode 129 is formed above the optical filter element 120a via an insulating layer 190. By forming the insulating layer 190 between the electrodes 128, 129, it is possible to prevent current flow between the electrodes 128, 129 to thereby cause voltage drop.

It should be noted that although the case in which the optical filter element 120a is etalon is explained here, the optical filter element 120a can be a fiber Bragg grating having a periodical refractive index variation provided to the core of the optical fiber. Since a fiber Bragg grating can be used as the optical fiber, the fiber Bragg grating can easily be deformed, and design freedom can be enhanced.

Further, although the wavelength selection characteristics of the optical filter element 120a are corrected using the electro-optic effect here, it is also possible to perform the correction using, for example, a thermooptic effect (denoting the phenomenon that the refractive index of the material with respect to light varies by applying heat). In this case, it is possible for the optical module 2 to have a member for supplying the optical filter element 120a with heat.

The optical module 2 and the atomic oscillator 1 have, for example, the following features.

According to the optical module 2, it is possible for the wavelength selection section 120 to decrease the intensity of the fundamental wave F of the first light L1 or to eliminate the fundamental wave F. Thus, it is possible to control or prevent the alkali metal atoms from being irradiated with the fundamental wave F making no contribution to the EIT phenomenon. Therefore, it is possible to reduce the frequency variation due to the AC Stark effect to thereby provide an oscillator with high frequency stability.

According to the optical module 2, since the wavelength selection device 120 has the optical filter characteristic control device 120b, the shift of the wavelength selection characteristics (the wavelength range of the light to be selected by the optical filter element) of the optical filter element 120a due to manufacturing error or environmental variations (e.g., in the heat and the light) can be corrected. Therefore, the wavelength selection device 120 is capable of accurately selecting the first sideband wave W1 and the second sideband wave W2 from the first light L1, and then emitting them.

In the case in which, for example, the optical filter element 120a is the etalon, the wavelength selection characteristics (the wavelength range of the light to be selected by the optical filter element) of the optical filter element 120a depends on the length D of the substrate 123 shown in FIG. 5 and the refractive index of the substrate 123. However, it is difficult to accurately control the length D of the substrate 123 in the manufacturing process of the optical filter element 120a, and therefore, there is a case in which manufacturing error impacts the length D of the substrate 123. Even in such a case, according to the optical module 2, since the optical filter characteristic control device 120b is provided, the shift in the wavelength selection characteristics due to the manufacturing error can be corrected.

In the optical module 2, the optical filter element 120a is the etalon. Therefore, the optical filter element can be made to have a simple configuration. Further, the material of the substrate 123 of the optical filter element (the etalon) 120a is compound semiconductor. Therefore, as compared to the case in which the material of the substrate 123 is $SiO_2$, the length D of the substrate 123 can be shortened, and downsizing of the device can be achieved.

In the optical module 2, the optical filter characteristic control device 120b is capable of varying the wavelength selection characteristics of the optical filter element 120a using the electro-optic effect. Thus, the wavelength selection characteristics of the optical filter element can easily be controlled with accuracy. Further, the optical filter characteristic control device 120b is configured including the first electrode 128 and the second electrode 129 for applying the voltage to the substrate 123. Therefore, the optical filter characteristic control device 120b can be made to have a simple configuration.

In the optical module 2, the wavelength selection device 120 and the semiconductor laser (the light source) 110 are provided to the base body 170. By providing the wavelength selection device 120 and the semiconductor laser 110 monolithically to the base body 170, downsizing of the device can be achieved.

As described above, in the optical module 2, the substrate 123 of the optical filter element (the etalon) 120a is the optical waveguide. Therefore, it is possible to control the beam diameter of the light L2 emitted from the optical filter element 120a to thereby efficiently irradiate the gas cell 130 with the light L2.

In the optical module 2, the semiconductor laser 110 is a surface emitting laser. Since the surface emitting laser requires a small current for generating the gain compared to the edge emitting laser, a reduction in power consumption can be achieved.

In the atomic oscillator 1, there is provided the optical module 2. Therefore, as described above, frequency stability can be enhanced.

It should be noted that the embodiment described above is an example and the invention is not limited thereto.

Figure 6:
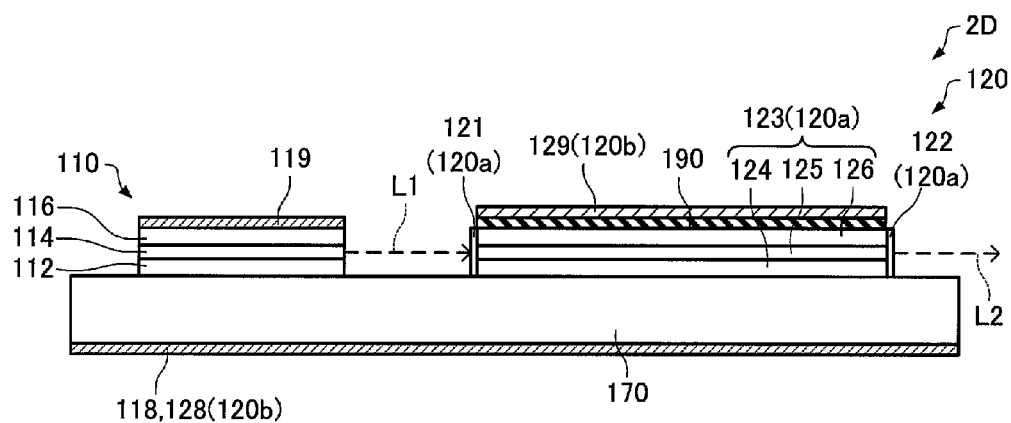
FIG. 6 is a cross-sectional view schematically showing a substantial part of an optical module according to the present embodiment using an edge emitting laser.

For example, although the semiconductor laser 110 shown in FIG. 5 described above is a surface emitting laser, the semiconductor laser can also be an edge emitting laser. FIG. 6 is a cross-sectional view schematically showing part of an optical module 2D using an edge emitting laser. Hereinafter, in the optical module 2D shown in FIG. 6, the constituents that are substantially the same as the constituents of the optical module 2 shown in FIG. 5 described above are denoted with the same reference numerals, and an explanation thereof will be omitted.

The first semiconductor layer 112 is formed on the base body 170. As the first semiconductor layer 112, a first conductivity type (e.g., an n-type) AlGaAs layer, for example, can be used.

The active layer 114 is formed on the first semiconductor layer 112. The active layer 114 has, for example, a multiple quantum well (MQW) structure having three quantum well structures stacked one on another each composed of a GaAs well layer and an AlGaAs barrier layer.

The second semiconductor layer 116 is formed on the active layer 114. As the second semiconductor layer 116, a second conductivity type (e.g., a p-type) AlGaAs layer, for example, can be used.

For example, the p-type second semiconductor layer 116, the active layer 114 with no impurity doped, and the n-type first semiconductor layer 112 constitute a pin diode. Each of the second semiconductor layer 116 and the first semiconductor layer 112 is a layer having a forbidden band width larger than that of the active layer 114 and a refractive index lower than that of the active layer 114. The active layer 114 has a function of amplifying the light. The first semiconductor layer 112 and the second semiconductor layer 116 have a function of sandwiching the active layer 114 to thereby confine injected carriers (electrons and holes) and the light therein.

In the semiconductor laser 110, when applying a forward bias voltage of the pin diode between the electrodes 118, 119, there occurs recombination of electrons and holes in the active layer 114. The recombination causes emission of light. The stimulated emission occurs in a chained manner from the light thus generated as an origin, and the light intensity is amplified. When the light gain exceeds the light loss, laser oscillation occurs to thereby generate a laser beam, and the laser beam (the first light L1) is emitted from the side surface of the active layer 114.

According to the optical module 2D, by using the edge emitting laser as the semiconductor laser 110, it is possible to emit the laser beam perpendicularly to the stacking direction of the layers 112, 114, and 116 of the semiconductor laser 110. Therefore, by controlling the film thickness of each of the layers 112, 114, and 116, the alignment between the semiconductor laser 110 and the wavelength selection device 120 can be achieved. Therefore, the alignment accuracy between the semiconductor laser 110 and the wavelength selection device 120 can be enhanced. Further, an optical element such as a prism for making the laser beam enter the wavelength selection device 120 becomes unnecessary.

As described above, although embodiments of the invention are hereinabove explained in detail, it should be understood by those skilled in the art that a number of modifications not substantially departing from the novel matters and the advantages of the invention are possible. Therefore, such modified examples are included in the scope of the invention.

What is claimed is:

1. An optical module for an atomic oscillator using a quantum interference effect, comprising:
    a light source adapted to emit light including a fundamental wave having a predetermined wavelength, and sideband waves of the fundamental wave;
    a wavelength selection section receiving the light from the light source, and adapted to transmit the sideband waves out of the light input;
    a gas cell encapsulating an alkali metal gas, and irradiated with light transmitted through the wavelength selection section; and
    a light detection section adapted to detect an intensity of light transmitted through the gas cell,
    wherein the wavelength selection section includes:
        an optical filter section adapted to transmit light having a wavelength within a predetermined wavelength range, and
        an optical filter characteristic control section adapted to vary the wavelength range of light to be transmitted by the optical filter section.

2. The optical module for an atomic oscillator according to claim 1, wherein,
    the optical filter section is an etalon, and
    the optical filter characteristic control section varies the wavelength range of the light to be transmitted by the optical filter section using an electro-optic effect.

3. The optical module for an atomic oscillator according to claim 2, wherein,
    the optical filter section includes:
        a first mirror and a second mirror opposed to each other and adapted to reflect the light input to the wavelength selection section, and
        a substrate disposed between the first mirror and the second mirror, and
    the substrate is a compound semiconductor.

4. The optical module for an atomic oscillator according to claim 3, wherein,
    the optical filter characteristic control section includes a first electrode and a second electrode adapted to apply a voltage to the substrate.

5. The optical module for an atomic oscillator according to claim 4, further comprising:
    a base body made of a compound semiconductor, and
    wherein the light source is a semiconductor laser,
    the optical filter section and the light source are located above the base body,
    the first electrode is located on an opposite side of the base body than a side on which the optical filter section is located, and
    the second electrode is located on an opposite side of the optical filter section than a side on which the base body is located.

6. The optical module for an atomic oscillator according to claim 5, wherein,
    the substrate of the optical filter section includes a first layer, a second layer, and a third layer stacked in this order from the base body side,
    a refractive index of the first layer and a refractive index of the third layer are smaller than a refractive index of the second layer, and
    the light emitted from the light source propagates through the second layer.

7. The optical module for an atomic oscillator according to claim 1, wherein,
    the light source is an edge emitting laser.

8. The optical module for an atomic oscillator according to claim 1, wherein,
the light source is a surface emitting laser.

9. An atomic oscillator comprising:
the optical module for an atomic oscillator according to claim 1.

10. An atomic oscillator comprising:
the optical module for an atomic oscillator according to claim 2.

11. An atomic oscillator comprising:
the optical module for an atomic oscillator according to claim 3.

12. An atomic oscillator comprising:
the optical module for an atomic oscillator according to claim 4.

13. An atomic oscillator comprising:
the optical module for an atomic oscillator according to claim 5.

14. An atomic oscillator comprising:
the optical module for an atomic oscillator according to claim 6.

15. An atomic oscillator comprising:
the optical module for an atomic oscillator according to claim 7.

16. An atomic oscillator comprising:
the optical module for an atomic oscillator according to claim 8.

17. An atomic oscillator using a quantum interference effect, comprising:
a light source adapted to emit light including a fundamental wave having a predetermined wavelength, and sideband waves of the fundamental wave;
a wavelength selection section receiving the light from the light source, and adapted to transmit the sideband waves;
a gas cell encapsulating an alkali metal gas, and irradiated with light transmitted through the wavelength selection section; and
a light detection section adapted to detect an intensity of light transmitted through the gas cell,
wherein the wavelength selection section includes:
an optical filter section adapted to transmit light having a wavelength within a predetermined wavelength range, and
an optical filter characteristic control section adapted to vary the wavelength range of light to be transmitted by the optical filter section.

* * * * *